United States Patent [19]

Doche

[11] Patent Number: 5,501,564
[45] Date of Patent: Mar. 26, 1996

[54] SYSTEM FOR THE STORAGE AND TRANSPORTATION OF FLAT OBJECTS SUCH AS EXTRA-FLAT BOXES AND ITS PORTABLE RACK

[75] Inventor: Claude Doche, Claix, France

[73] Assignee: Commissariat a l'Energie Atomique, France

[21] Appl. No.: 131,211

[22] Filed: Oct. 1, 1993

[30] Foreign Application Priority Data

Oct. 16, 1992 [FR] France ................................ 92 12424

[51] Int. Cl.⁶ ........................................ B65G 1/04
[52] U.S. Cl. .................... 414/331; 414/416; 414/217; 414/939; 414/937; 118/500; 224/270; 224/272
[58] Field of Search .................... 414/331, 937, 414/935, 940, 939, 217, 403, 418, 416, 417; 224/101, 242, 247, 270, 272; 118/719, 500; 211/13, 71, 134, 153, 41; 206/454, 564; 220/752, 755, 1.5

[56] References Cited

U.S. PATENT DOCUMENTS

| | | | |
|---|---|---|---|
| 4,153,164 | 5/1979 | Hofmeister | 118/500 X |
| 4,636,128 | 1/1987 | Millis et al. | 414/217 |
| 4,759,681 | 7/1988 | Nagami | 414/331 X |
| 4,872,554 | 10/1989 | Quernemoen | 118/500 X |
| 4,900,212 | 2/1990 | Mikahara | 414/331 X |

FOREIGN PATENT DOCUMENTS

| | | |
|---|---|---|
| 0115357 | 8/1984 | European Pat. Off. . |
| 0302542 | 2/1989 | European Pat. Off. . |
| 3539957 | 6/1987 | Germany . |
| 99046 | 5/1987 | Japan ........................ 414/331 |
| 290300 | 11/1989 | Japan ........................ 414/331 |

*Primary Examiner*—Frank E. Werner
*Attorney, Agent, or Firm*—Hayes, Soloway, Hennessey, Grossman & Hage

[57] ABSTRACT

According to the present invention, a system for storing and distributing flat objects to different working stations is provided. The system comprises storage modules (2), transportation or conveying modules (4, 4A) and distribution modules (5). All these modules are placed alongside one another to form a continuous chain. Each module has fixed or mobile rollers (7) constituting two superimposed displacement tracks for operating in two opposite directions. Portable racks (20) are also provided. Particular utility is found in storage and transportation of boxes containing silicon wafers.

8 Claims, 4 Drawing Sheets

5,501,564

SYSTEM FOR THE STORAGE AND TRANSPORTATION OF FLAT OBJECTS SUCH AS EXTRA-FLAT BOXES AND ITS PORTABLE RACK

FIELD OF THE INVENTION

The invention relates to the storage and transportation of flat objects during the manufacture, or processing thereof, or the manufacture or processing of the articles contained therein. The invention more particularly applies to extra-flat boxes containing silicon wafers under an ultra-clean atmosphere. These silicon wafers are used in the manufacture of integrated circuits in the electronics and microelectronics fields. However, the invention can also apply to any random flat object.

1. Prior Art and Set Problem

When manufacturing electronic circuits on circular silicon wafers, the different operations are performed in working stations under an ultra-clean atmosphere. The silicon wafers are in each case manipulated, stored and transported in an individual tight box, which are opened on entering each working station within which the objects contained in the boxes are taken over, each individual box remaining at the intake of the working station.

It is therefore necessary to be able to store, control and transport in a regular manner said extra-flat boxes in order to satisfactorily manufacture the electronic circuits.

The object of the invention is therefore to propose a system making it possible to transport and store in a controlled manner a large number of flat objects, such as extra-flat boxes.

2. Summary of the Invention

The invention therefore mainly relates to a system for the storage and transportation of flat objects, such as extra-flat boxes, for supplying one or more working stations with flat objects, said flat objects being individually transported, the system comprising means for the groupwise storage of the flat objects, means for transporting in individual manner flat objects stored in the storage means constituting a bidirectional conveyor having two tracks each travelling in an opposite direction and distribution means for the objects transported by the transporting or conveying means.

According to the invention, the transporting or conveying means are displacement modules each having an elementary portion of each track, the distribution means are distribution modules, the storage means are storage modules for the flat objects, each incorporating a portable rack having horizontal shelves in a frame-like structure for receiving the objects to be stored, a fixed structure, a chassis vertically mobile in the fixed structure and constituted by two U-shaped uprights at the top of which are located at least two conveying rollers driven by motor means in order to permit the extraction of the flat object stored at the very bottom of the rack and supply it to a track of an adjacent module and a piston mounted so as to slide vertically in the chassis and at the top of which can be placed the portable rack, all of the said modules being juxtaposed in order to form the two tracks.

The preferred construction of the displacement modules provides for each of the said modules to be equipped with at least two transporting or conveying rollers per track and a motor for rotating the rollers. This construction preferably comprises a carrying structure, two fixed H chassis, each placed level with a track, two pairs of displacement rollers for each track placed between the branches of the H chassis, the rollers rotating about rotation shafts issuing outside of the H chassis by a driving wheel receiving a belt driven by the motor.

Preferably, the assembly of the two fixed chassis and the motor is mounted so as to rotate about a vertical axis in order to pivot into a horizontal plane the two track portions.

According to a preferred construction of the distribution modules, they have an elevator for sampling objects on the two tracks and which constitutes, when stationary, one of the two tracks.

The elevator is constituted by a distribution platform fixed to a vertical piston slidingly mounted in a hollow piston integral with a carrying base of two sets of horizontal rollers, the hollow piston being mounted so as to slide vertically in a cylinder, so that the base can in turn be positioned level with the two tracks, whilst the platform can be installed at a distribution level.

In its lower part, the portable rack preferably has means for fixing the rack to the upper part of the piston and, in its upper part, a handling handle equipped with means for controlling the locking and unlocking of the fixing means to the piston.

The rack also constitutes another main object of the invention.

LIST OF DRAWINGS

The invention is described in greater detail hereinafter relative to non-limitative embodiments and the attached drawings, wherein show:

FIG. 1—The system according to the invention in its application to a working station under a conditioned atmosphere.

FIG. 2—A storage means used in the system according to the invention.

FIG. 3—In section, a distribution means used in the system according to the invention.

FIG. 4—A transportation or conveying means used in the system according to the invention.

DETAILED DESCRIPTION OF AN EMBODIMENT

Figure 1:
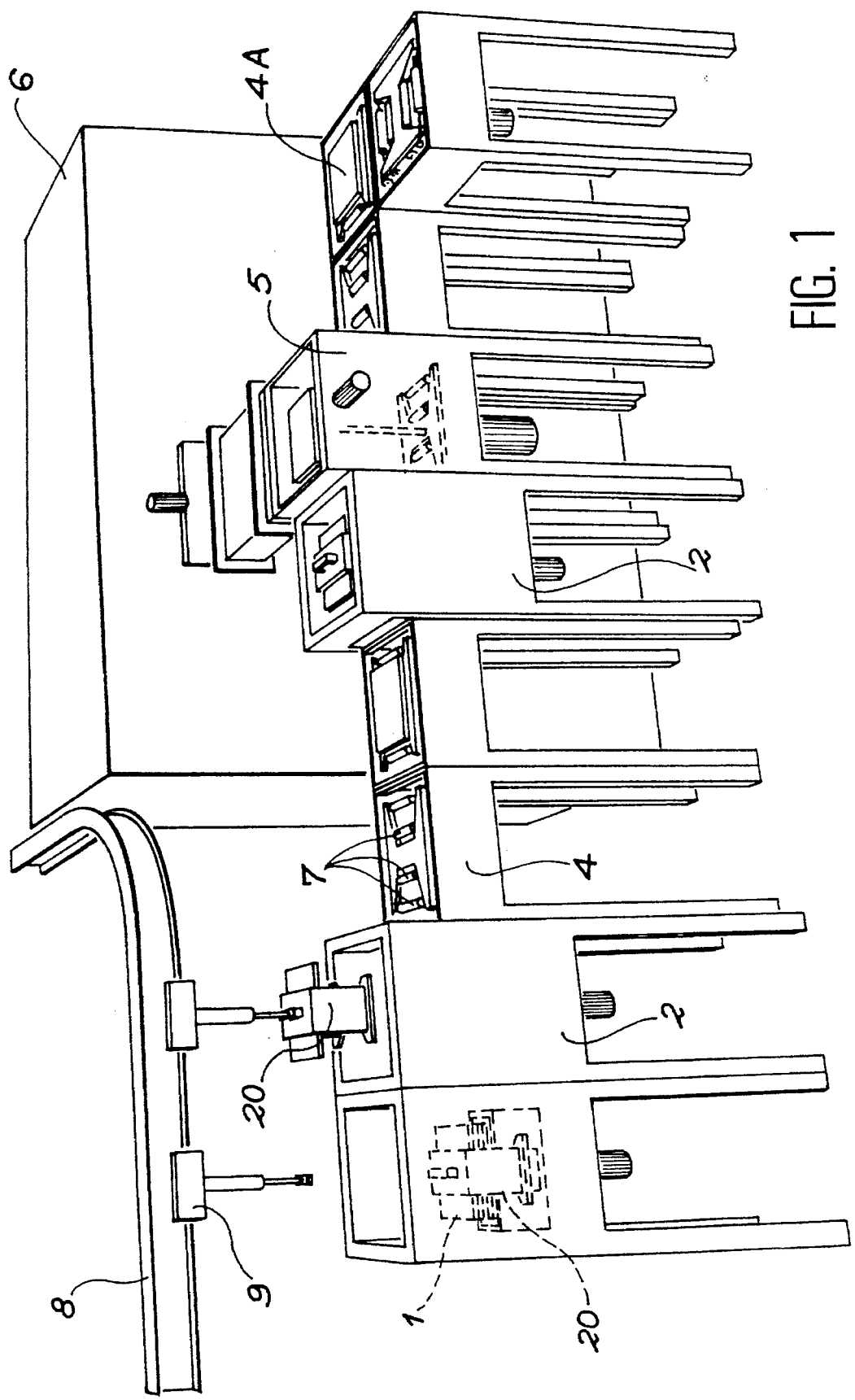

In FIG. 1 the system according to the invention is shown in its application for supplying at least one working station 6 constituted by a machine confined in an ultra-clean environment. The system according to the invention stores and transports flat objects 1, such as extra-flat boxes. These flat objects are stored in series and transported or conveyed so that they can be successively despatched to the working station 6.

In the preferred application of the system according to the invention, said flat objects 1 are extra-flat boxes containing silicon wafers. The latter are treated in a tight working station 6, i.e. the silicon wafers are confined in a special atmosphere. In order to respect this atmosphere, the extra-flat boxes 1 are tight. Thus, the system according to the invention comprises storage means, transportation means and distribution means for the boxes 1.

According to the invention, the transportation or conveying means are constituted by a plurality of displacement modules 4. The distribution means are constituted by the same number of distribution modules 5 as there are working stations 6 to be served. The storage means are constituted by storage modules 2 able to receive a portable rack 20 for storing the boxes 1.

All these elements form a bidirectional conveyor, i.e. able to convey the boxes 1 in two opposite directions. For this purpose, these different elements are placed against one another so as to form a continuous chain, each element forming a link. Thus, each of these elements has conveying or transportation rollers 7 placed in two different horizontal planes, which are parallel to one another so as to fore two continuous rolling tracks. The spacing between each roller 7 is less than the length or width of the conveyed boxes 1. Thus, each box 1 can be moved from one module to the other following a continuous track. As is demonstrated by the module 4A to the right of FIG. 1, the continuous chain can have direction changes, if adjacent modules are placed on non-opposite faces.

Figure 2:
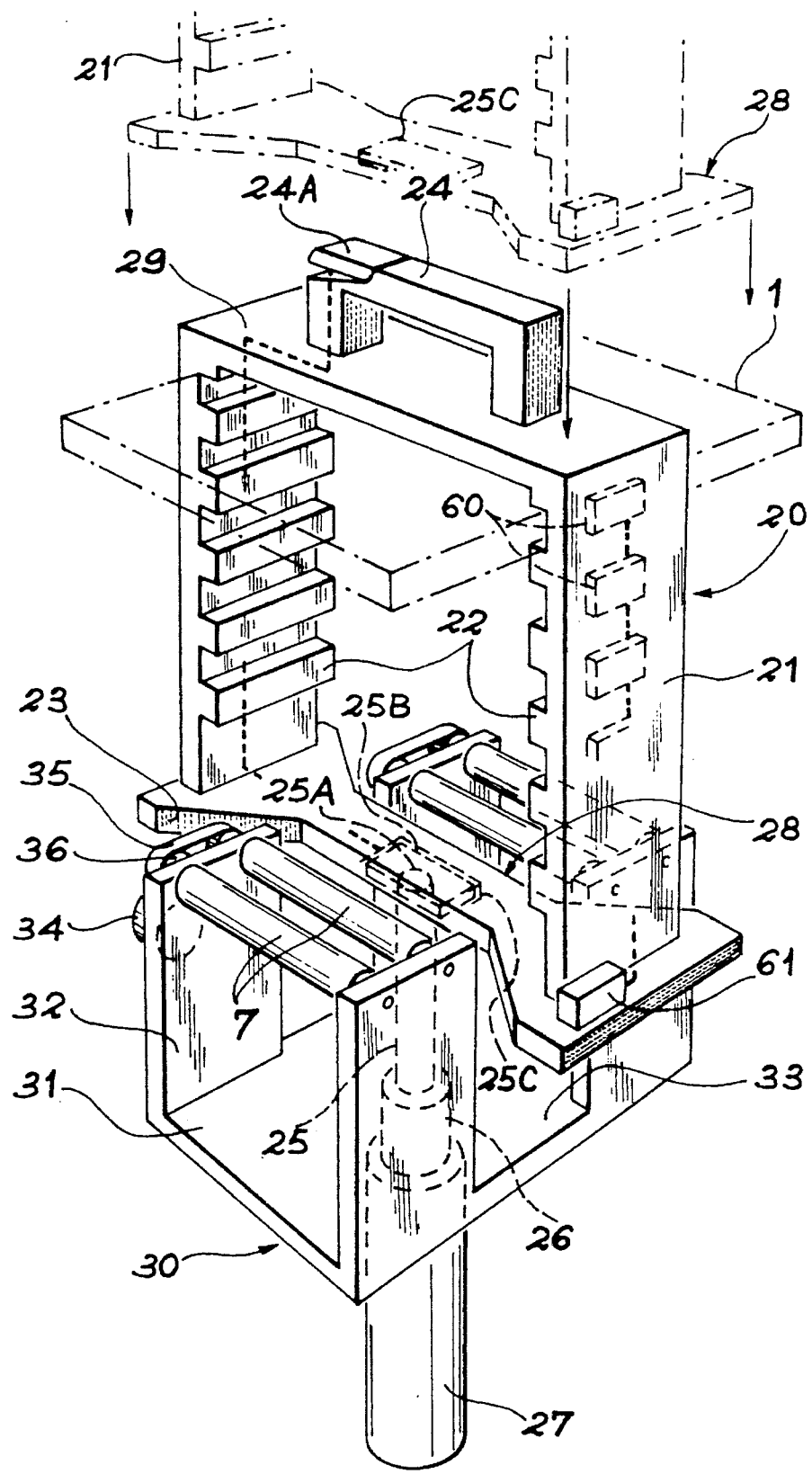

With reference to FIG. 2, the storage modules 2 of FIG. 1 constituting the storage means can be constructed in the following way. In FIG. 2, the outer envelope of the structure of the storage module has been removed. It is possible to see a portable rack 20 for supporting a given number of flat boxes 1 by means of reciprocally parallel shelves 22. This portable rack 20 forms part of the system, but also constitutes an independent element, in the sense that it can be moved and used outside the system. It is formed by a gantry structure 21, the shelves 22 being placed on the vertical uprights of said structure 21 of the portable rack 20. A handling handle 24 can be provided on the upper part 29 of the structure 21.

The base 23 of the structure 21 has a central part 28 narrower than the ends of said base 23. The recesses provided by said central, narrow part 28 of the base 23 make it possible to create a space into which can be vertically translated the rollers 7 of said storage module. Thus, as each storage module must have rollers 7 making it possible to horizontally displace the boxes 1, a U-shaped chassis 30 is provided, this applying no matter whether it is viewed from the front or the side. In other words, the chassis 30 has a flat base 31 on which are fixed in pairs four vertical uprights 32. They are spaced in pairs so as to permit the installation of the parallel rollers 7 between two uprights 32 in accordance with a first direction. These rollers 7 are horizontal and rotate between two uprights 32. In a perpendicular direction, two uprights 32 are spaced from one another by a distance 33, whose width exceeds the width of the central part 28 of the base 23 of the portable rack 20. Therefore a vertical downwards translation of the portable rack 20 within the chassis 30 with the base 23 penetrating the space 33 enables the rollers 7 to be installed level with any random shelf 22 of the rack 20. Thus, any random flat box 1 placed in a shelf 22 could be reached by the rollers 7 and raised by the latter as soon as there are no boxes below it. The rotation of the two rollers 7 takes place by means of a motor 34 placed on the corresponding upright 32, driving by a driving belt 35 driving wheels 36 integral in rotation with the rollers 7.

Therefore the portable rack 20 is mobile, by means of the handling handle 24 and can be detached from the remainder of the storage module. In the same way the portable rack 20 can be placed on a portion of the remainder of the storage module constituted by a plate 25B positioned at the top 25A of a piston 25. The latter slides within a hollow, vertical piston 26 integral with the base 31 of the chassis 30.

The portable rack 20 can be locked on the plate 25B of the piston 25 by a fixing means, which can be a mechanical catch system 25C. Thus, the handling handle 24 can have means 24A for controlling the locking and unlocking of such a means for fixing the rack 20 to the piston 25.

Furthermore, the hollow piston 26 is mounted in sliding manner within a cylinder 27, which is fixed in the storage module structure. Thus, both the portable rack 20 and the chassis 30 are mobile in translation with respect to one another, but also with respect to the storage module in which they are placed. Therefore the rollers 7 can be placed level with the rollers of the two tracks of two adjacent modules in order to form intermediate rollers for one track between two adjacent modules. In the same way, the flat boxes 1 placed in the shelves 22 of the portable rack 20 can all be lowered on the rollers 7 when placed level with the two tracks. In other words, the lowest flat box 1 in the shelves 22 of the portable rack 20 can still be placed on the rollers 7 and dispatched on one of the two superimposed tracks.

It is advantageous to provide on the structure 21 of the portable rack 20, at each stage and facing the shelf 22, a device 60 for locking and unlocking the objects stored in the corresponding shelf. These different locking and unlocking devices 60 can be located outside the structure 21 and can be superimposed. They can be of the electromechanical or electromagnetic type. They can be controlled by the central control means of the system via a connection 61, e.g. placed on the base 28 of the portable rack 20 and can be connected to a corresponding connection of the central control system. It is therefore possible to control the release or locking of one of the objects stored on the shelves of the portable rack 20.

Figure 3:
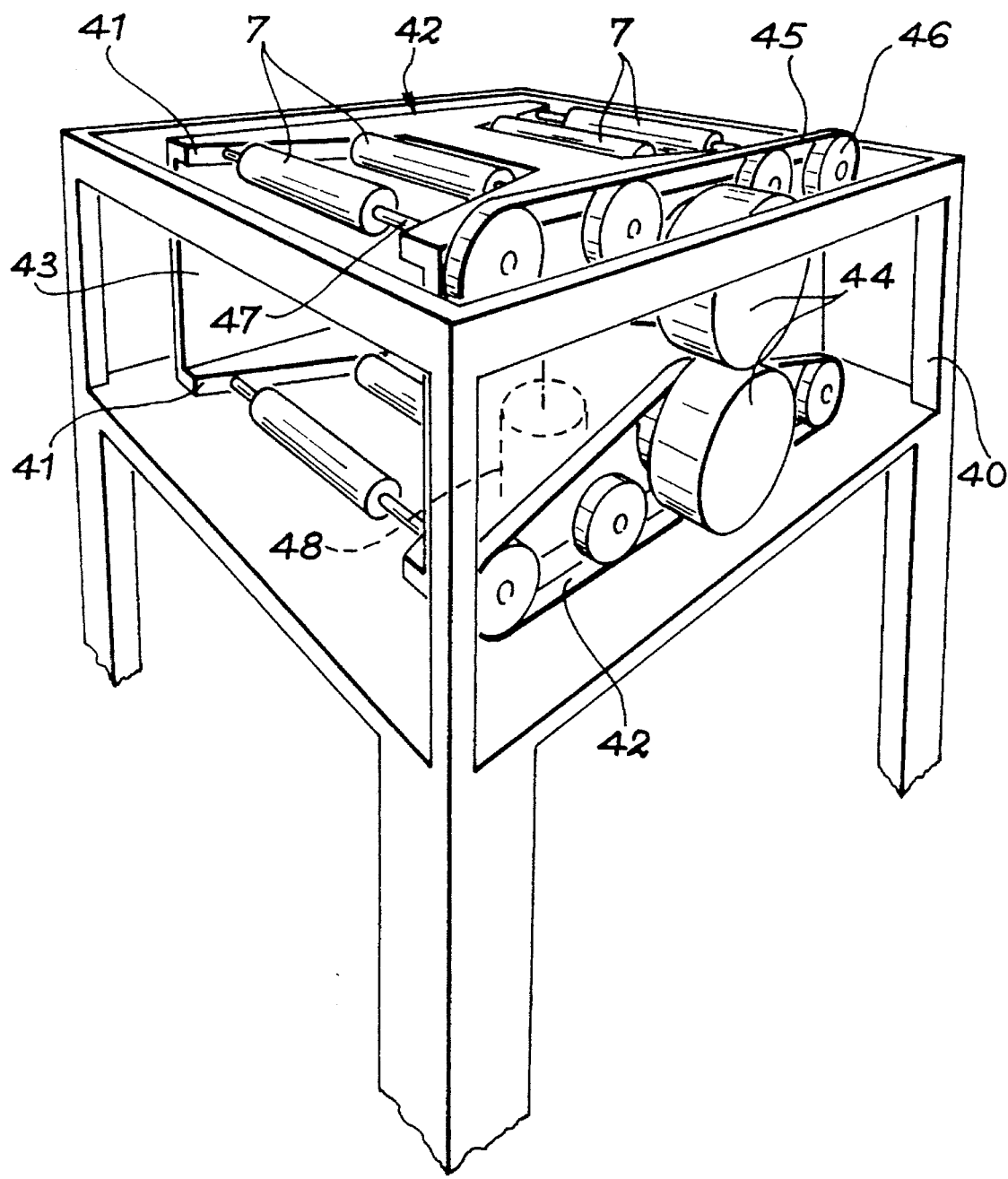

With reference to FIG. 3, the displacement modules 4, 4A are preferably constructed in the following way. A main, parallelepipedic structure 40 envelopes the operational elements of said displacement module. Level with the two tracks, the latter mainly comprises two sets of parallel rollers 7 rotating about a horizontal axis between the branches 41 of a horizontal H platform 42. In view of the fact that there are two superimposed tracks, use is made of two parallel, horizontal platforms 42, which are rendered integral with one another by vertical uprights 43. This leads to two stages of rollers 7 corresponding to the two levels of the two tracks of the conveyor constituted by said displacement modules, said storage modules and said distribution modules.

The rollers 7 of one stage are driven by a motor 44, by means of a transmission belt 45 and a driving wheel 46 positioned at the end of each shaft 47 around which is mounted in rotary manner a roller 7. The motor 44 drives either one of the driving wheels 46, or directly the driving belt 45. Two motors 44 are shown, one motor being provided for each displacement module.

To the right FIG. 1 shows a displacement module 4A constituting a 90° direction change for the two conveyor tracks. In this case, each displacement module comprises a vertical rotation shaft 48 integral with the H structure formed by the uprights 43 and the platforms 42 and mounted so as to rotate in the structure 40 of the displacement module. Thus, the rollers 7 of the two levels can be located in all directions, in particular directions perpendicular to one another in order to form a 90° direction change.

Figure 4:
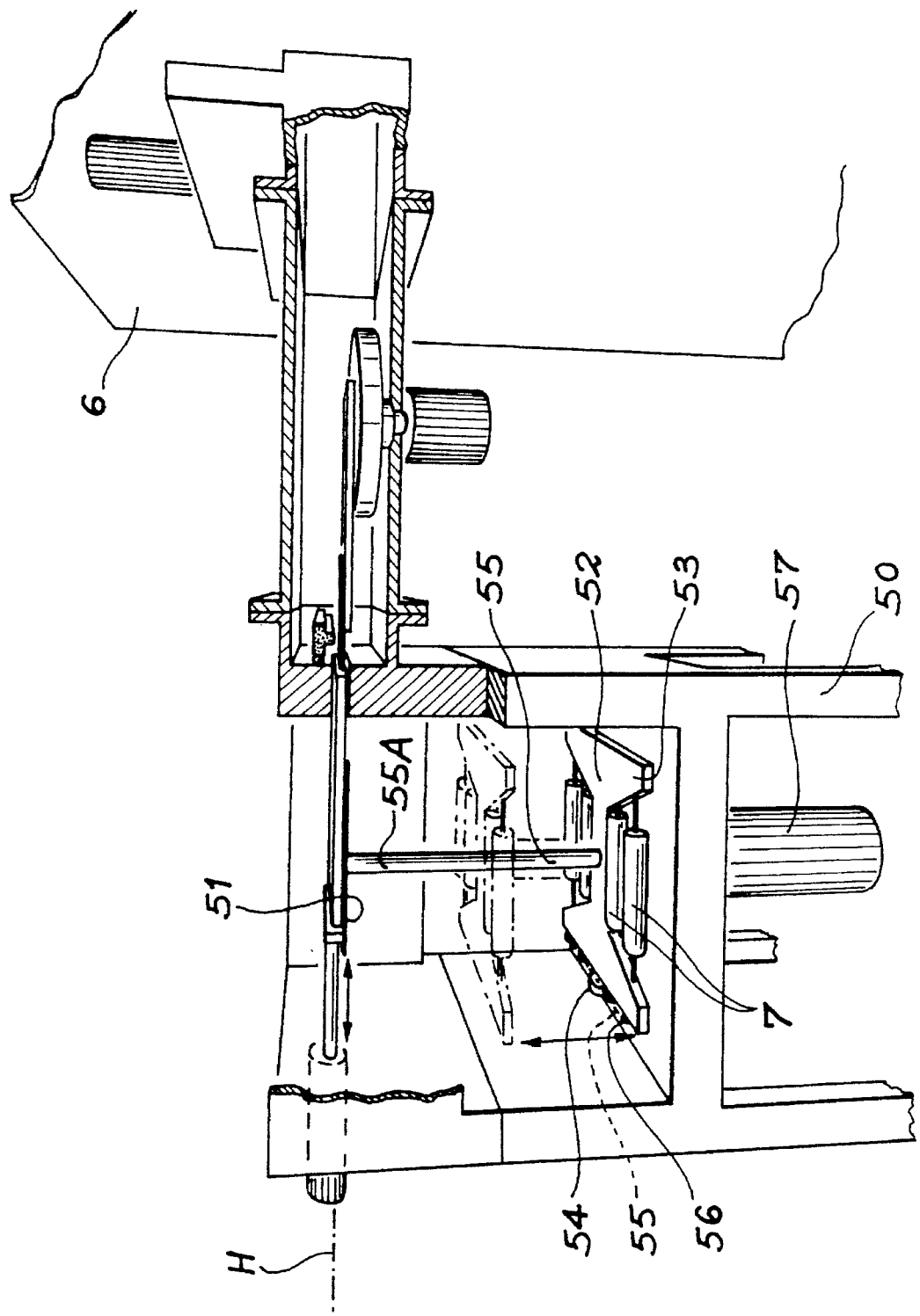

FIG. 4 shows in section a distribution module of the system according to the invention, which also has a stage of rollers 7 which can be placed level with the two conveyor tracks. Such a distribution module comprises an external structure 50 within which is installed in vertically mobile manner a H base 52 supporting two sets of two rollers 7. The latter are mounted so as to rotate horizontally between the branches 53 of the H base 52. The assembly is completed by a motor 54 rotating an assembly constituted by a belt 55 and driving wheels 56, each placed at the end of a shaft integral in rotation with a roller 7. This assembly is mounted so as to be vertically mobile by means of a not shown hollow piston, which in turn slides within a cylinder 57. Within the latter is slidingly installed a piston 55, to whose end 55A is fixed a distribution platform 51. Thus, the distribution platform 51 and the base 52 are mounted so as to be mobile in translation in the same way as the portable rack 20 and the chassis 30 of the storage module. The piston 55 and the platform 51 form an elevator for the flat objects.

It is therefore possible to place the rollers 7 level with the two tracks of the conveyor, the distribution platform 51 being engaged against the base 52. It is pointed out in this connection that the distribution platform 51 is thin, so as not to project with respect to the rollers 7 when engaged against the base 52. In this way, the rollers 7 can ensure the continuity of the two conveyor tracks.

However, when it is a question of supplying a flat box 1 to the intake of a working station 6, the distribution platform 51 is installed by raising the box 1 in question in order to hoist it to the level H, where it is taken over by the external members.

The motors and pistons are controlled by the control means with respect to the storage, transportation and distribution of the flat boxes. It is therefore possible to control the storage and distribution to the different working stations 6 of a large number of flat boxes 1 by means of the system according to the invention.

Any random storage module 2 can be placed between the displacement modules 4 and the distribution modules 5 in order to form a buffer store between two box treatment and transportation stages. It is therefore possible to obtain any random conveying travel within a workshop between the different working stations 6.

The system according to the invention has been described relative to flat boxes. It is pointed out that these flat boxes in each case contain a silicon wafer on which can be manufactured integrated circuits under very demanding working and cleanness conditions. Other applications can be provided for any other random flat objects, provided that the shelves of the portable racks and the spacing of the rollers are fixed as a function thereof.

I claim:

1. A system for storage and transportation of flat objects (1) for supplying at least one location (6) with objects (1), said objects being individually transported, said system comprising means for groupwise storage of flat objects (1), means for individual transportation of the flat objects (1) stored in the storage means and constituting a bidirectional conveyor having two tracks moving in two opposite directions, means for distribution of the flat objects (1) transported by the transporting means and wherein, the transporting means include displacement modules (4) having an elementary portion of each track, the distribution means include distribution modules (5), the means for the groupwise storage of the flat objects (1) are constituted by modules for storing the objects (1) each incorporating a portable rack (20) having a frame structure (21) comprising a base (2), a narrow central part (28), an upper part (29), and having shelves (22) located within the structure (21) for receiving the flat objects (1), and a handle (24), a fixed structure (27), a chassis (30) constituted by two parallel, U-shaped uprights (32) at the top of which are provided at least two rollers (7) issuing to the outside of the uprights (32) by a driving wheel (36) itself receiving a belt (35) driven by a motor (34), said chassis (30) being vertically mobile in the fixed structure (27) and a piston (25) mobile and sliding in a hollow piston (26) integral with the chassis (30) for receiving the portable rack (20), all of the said modules (2, 4, 4A, 5) being juxtaposed in order to constitute the two tracks.

2. A system according to claim 1, wherein each of the displacement modules (4) is equipped with at least two conveying rollers (7) per track and a motor (44) for rotating the rollers (7).

3. A system according to claim 2, wherein the displacement modules (4) comprise a carrying structure (40), two H chassis (42) fixed in vertical translation, each chassis (42) being positioned level with said track, two sets of two rollers (7) for each track placed between the branches (41) of the H chassis (42), the rollers (7) rotating about rotation shafts issuing outside the branches (41) by a driving wheel (46) receiving a belt (45) driven by the motor (44).

4. A system according to claim 3, and comprising an assembly of two H chassis (42) which rotate about a vertical axis in order to pivot the two track portions in a horizontal plane.

5. A system according to claim 1, wherein the distribution modules incorporate an elevator for sampling flat objects (1) on the two tracks.

6. A system according to claim 5, wherein the elevator comprises a distribution platform (51) fixed to a vertical piston (55) slidingly mounted in a hollow piston integral with a carrying base (52) of two sets of horizontal rollers (7), the hollow piston being mounted so as to slide vertically in a cylinder (57) in such a way that the base (52) can in turn be positioned level with the two tracks and that the platform (51) can be installed at a distribution level (H).

7. A system according to claim 1, wherein in its lower part, the portable rack (20) has means for the temporary fixing to an upper part of the piston (25A) and to its upper part of a handling handle (24) equipped with means (24A) for controlling the locking and unlocking of the means for fixing the portable rack (20) to the top of the piston (25A).

8. A system rack according to claim 1, wherein said portable rack also comprises a catch system (25C) on a plate (25B) of the storage and distribution system and means system (25C) located on the handle (24), which is placed on the upper part (29).

* * * * *

UNITED STATES PATENT AND TRADEMARK OFFICE
CERTIFICATE OF CORRECTION

PATENT NO.   : 5,501,564
DATED        : March 26, 1996
INVENTOR(S)  : Claude DOCHE It is certified that error appears in the above-indentified patent and that said Letters Patent is hereby corrected as shown below:

Claim 8, Col. 6, line 52, after "means" insert -- (24A) for controlling locking and unlocking of the catch--.

Signed and Sealed this

Twenty-first Day of January, 1997

Attest:

BRUCE LEHMAN

*Attesting Officer*     *Commissioner of Patents and Trademarks*